United States Patent

Grace

[15] 3,646,357

[45] Feb. 29, 1972

[54] SEMICONDUCTOR DIODE HIGH FREQUENCY SIGNAL GENERATOR

[72] Inventor: Martin I. Grace, Framingham, Mass.

[73] Assignee: Sperry Rand Corporation

[22] Filed: Mar. 27, 1970

[21] Appl. No.: 23,130

[52] U.S. Cl. ........................307/88.3, 307/88 R, 321/69 W, 321/69 NL, 330/4.9, 330/5, 330/34, 330/53, 330/56, 331/96, 331/107 R

[51] Int. Cl. ........................................................H03f 3/10

[58] Field of Search ................330/34, 53, 56, 5; 331/107 R, 331/96; 321/69; 307/88.3

[56] References Cited

UNITED STATES PATENTS

| | | | |
|---|---|---|---|
| 3,464,020 | 8/1969 | Koyama et al. | 330/5 |
| 3,212,018 | 10/1965 | Amoss et al. | 330/4.9 |

OTHER PUBLICATIONS

Walsh et al., Stabilized Supercritical Transferred Electron Amplifiers " IEEE Journal of Solid-State Circuits," Dec. 1969, pp. 374- 376.

Hoefflinger et al., " IEEE Journal of Solid- State Circuits," Dec. 1969, pp. 391- 395.

Haddad et al., " IEEE Transactions on Microwave Theory and Techniques," Nov. 1970, pp. 752- 772 (pp. 765- 772 relied on).

*Primary Examiner*—Roy Lake

*Assistant Examiner*—Darwin R. Hostetter

*Attorney*—S. C. Yeaton

[57] ABSTRACT

A microwave or high-frequency amplifier or frequency converter is disclosed which exploits avalanche phenomena in a semiconductor high-efficiency mode diode placed in a multiply tuned waveguide transmission line circuit. The novel configuration features means substantially avoiding loss of power within the circuit when high frequency or microwave energy is not present in the circuit; such energy may be efficiently amplified or converted when actually present in the circuit.

6 Claims, 2 Drawing Figures

PATENTED FEB 29 1972 3,646,357

INVENTOR
MARTIN I. GRACE
BY
H P Ferry
ATTORNEY

SEMICONDUCTOR DIODE HIGH-FREQUENCY SIGNAL GENERATOR

BACKGROUND OF THE INVENTION

1. Field of the Invention

The invention pertains to the art of efficient generation of microwave or high frequency signals in transmission line devices. More particularly, the invention pertains to means for efficient amplification of or frequency conversion or multiplication of such microwave or high frequency signals with simple, compact, and inexpensive transmission line elements and active elements such as semiconductor diodes without dissipation of energy in the quiescent state.

2. Description of the Prior Art

Fundamental high frequency oscillations have often been observed in systems combining cavity or other resonator or high frequency transmission lines with active semiconductor diodes exhibiting useful negative resistance effects when placed in suitable bias fields under pulsed as well as under continuous wave operation. Diodes having abrupt PN-junctions have, for example, been used in such circuit configurations. Efficiencies of fundamental signal generation from very low values to as high as 40 percent have been demonstrated with continuous wave operation of such diode oscillators.

Efficient generation of both fundamental and harmonic energy in similarly uncomplex circuits has not advanced in suitable degree. For example, the possibility of very high frequency, high-efficiency-mode diode operation in a transmission line free of transmission line moding problems has made the idea of using waveguide attractive. However, such operation of high-efficiency-mode semiconductor diodes has not been demonstrated, in part because it has been difficult to devise a waveguide structural configuration providing fundamental and harmonic mode energy in the relation required by the diode for high-efficiency-mode diode operation. As will be seen, the prior art has not been capable of placing the diode simultaneously in a waveguide field resonant at the fundamental frequency $\omega_F$ and simultaneously resonant also at harmonics $\omega_H$ thereof.

In part, the problems associated with the prior art have been concerned with devising suitable means of independently matching, tuning, and otherwise adjusting the individual parts of the circuit in which fundamental and harmonic signals mutually or separately flow. In part, there have also been problems not fully solved that are traceable to the nature of the negative resistance properties of many types of semiconductor diodes, some of which problems occur only in the environment of a microwave field. In the case of diodes exhibiting avalanche effects, for instance, certain parametric effects also may be present. These characteristics are not always stable in nature and appear and interact in unpredictable and undesirable ways.

SUMMARY OF THE INVENTION

The invention is a microwave or high frequency signal amplifier or frequency converter employing a high-efficiency mode semiconductor diode as an active negative resistance device in a multiply tuned transmission line circuit of the ridged waveguide type. The waveguide circuit is shunted by the active semiconductor diode. Impedance matching devices, consisting of sections of low impedance transmission line and located in a novel manner between the diode and an external load, are used to adjust the circuit for high-efficiency-mode diode operation. Such matching devices interact with the fields adjacent a ridged portion of the waveguide in which the active diode is located.

In operation, a unidirectional potential is applied across the high-efficiency-mode semiconductor diode such that it is biased close to its breakdown level. The high frequency or microwave signal, when superimposed upon the bias, produces large changes in the instantaneous diode voltage and current, which changes are such that a large negative resistance is generated at the same frequency as the fundamental frequency $\omega_F$ of the applied high frequency signal. The current wave contains many harmonic components which are also coupled to the oscillating harmonic high frequency field to produce amplified harmonic signals, thereby improving the conversion efficiency of the diode.

DESCRIPTION OF THE PREFERRED EMBODIMENT

Figure 1:
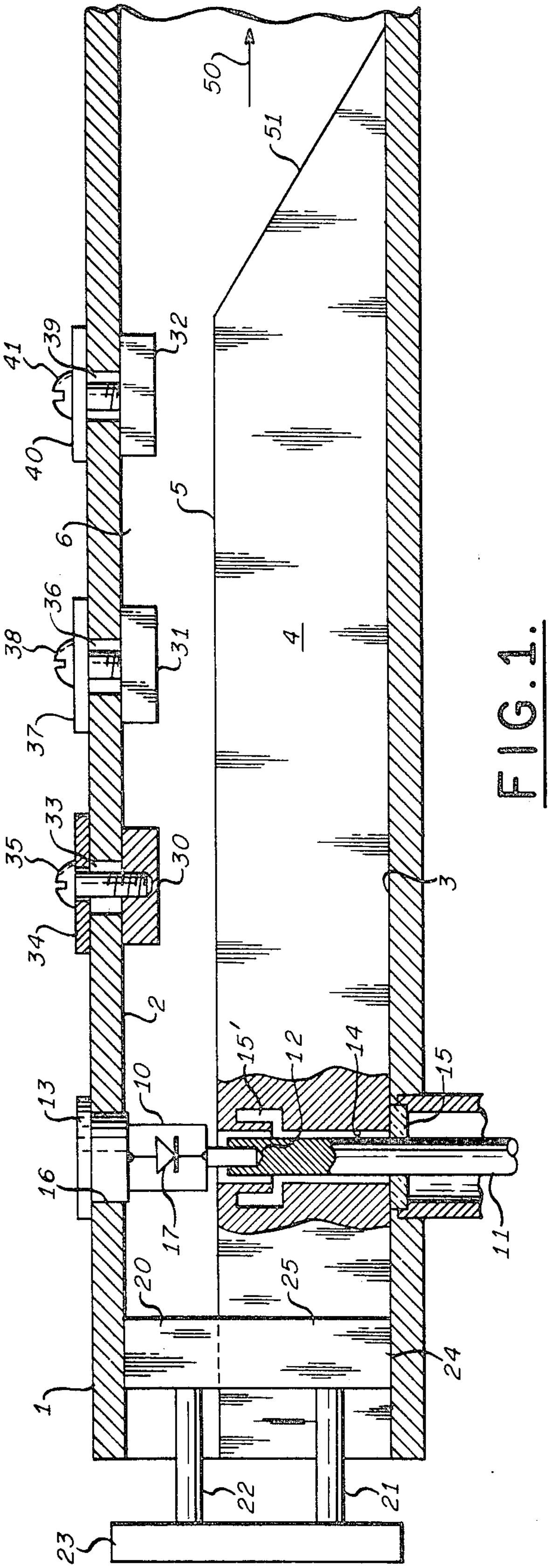
FIG. 1 is a cross section elevation view of the preferred embodiment of the invention.

FIG. 1 shows a signal converter or amplifier and frequency multiplier according to the present invention comprising a section of hollow waveguide transmission line 1. The preferred form of transmission line 1 is the conventional ridged waveguide having a generally rectangular cross section with opposed broad walls 2 and 3. The inner surface of wall 3 is provided with a centrally located reentrant ridge 4, as in conventional practice. The surface 5 of ridge 4 is relatively close to wall 2 of the guide 1 so that the electric field of electromagnetic waves propagating within the waveguide is largely concentrated in the TE mode and in the region between surface 5 and wall 2. As is usual in high frequency circuits, the respective current carrying surfaces of ridge 4 and walls 2 and 3 and their connecting walls, such as wall 6, have good electrical conductivity for high frequency electrical currents.

In shunt with waveguide 1, spanning the gap between wall 2 and the surface 5 of ridge 4, is a semiconductor diode 10 whose particular detailed characteristics remain to be described. Diode 10 is poled as symbolically indicated by the representation 17 shown as if actually drawn on the surface of the diode package. At one end, diode 10 is supported in any convenient conventional manner from wall 2, as being placed within a hole 16 in wall 2 and cemented in place therein or otherwise held in place by cap 13. Opposite cap 13, diode 10 is equipped with a short lead 12 fitting within a conductor 11 extending through a hole 14 in ridge 5 and held in place by insulating washer 15. A conventional high frequency wave shorting means 15 may surround hole 14 so as to prevent passage therethrough of microwave energy. A bias voltage may be supplied by a bias source (not shown) between lead 11 and cap 13. It is to be understood that many types of diode packages are available and that the particular package illustrated is merely a representative one selected for ease of illustration.

Adjacent diode 10 is supplied an adjustable short circuiting means 20 having a shape substantially matching the interior shape of ridged wave guide 1 so that shorting means 20 straddles ridge 5 and has arms such as arm 24 extending downward into the guide regions on either side of ridge 5. The position of shorting means 20 relative to diode 10 may be adjusted by using the handle 23 attached to shorting means 20 by two or more rods, such as rods 21 and 22. At least the inner face 25 of shorting means 20 is also comprised of good electrical conducting material.

At certain intervals within the above described structure are placed adjustable impedance matching or transforming elements 30, 31, and 32. The susceptance matching or transforming element 30, for instance, may comprise a solid block of electrically conductive metal with means permitting it to be moved longitudinally within guide 1 in contact with the inner surface 2 thereof. A short longitudinal slot 33 through the wall 2 of guide 1 permits element 30 to be adjusted and then to be fixed in position by tightening a screw 35 against washer 34, screw 35 being threaded into a mating threaded hole in element 30. The position of the similarly formed impedance transformer element 31 may also be adjusted longitudinally and then fixed in position by virtue of slot 36, washer 37, and a screw 38 which is threaded into element 31. A third and similarly formed impedance transforming element 32 cooperates in the same manner with a slot 39, washer 40, and screw 41, and may be similarly adjusted in position and then fixed. It should be observed that impedance matching or transforming elements 30, 31, and 32 are themselves known devices and individually operate generally as they have in past usage. In the present invention, they cooperate in an unusual manner which is yet to be explained. They may, of course, be adjusted in position and then permanently fixed in place, as by soldering.

The type of diode known generically as the avalanche transit time diode has been found to have characteristics needed for use in the invention as diode 10. It may be used either in the form known as the impact avalanche transit time diode, for which the accepted acronym is the IMPATT diode, or in the form of the trapped plasma avalanche triggered transit diode known as the TRAPATT diode. Diode 10 may be, for example, an epitaxial silicon or other PN or step or abrupt junction diode or a $PNN^+$ punchthrough diode designed such that, with an electric field of suitable amplitude present, the field punches through a substrate at reverse breakdown. Such diodes have, for example, been described as being successfully formed by diffusing boron from a boron-nitride source into a phosphorous-doped epitaxial material on a heavily doped antimony substrate. The thickness of the epitaxial layer is varied by etching, prior to diffusion, so as to produce either the abrupt PN structure or the $PNN^+$ structure.

Figure 2:
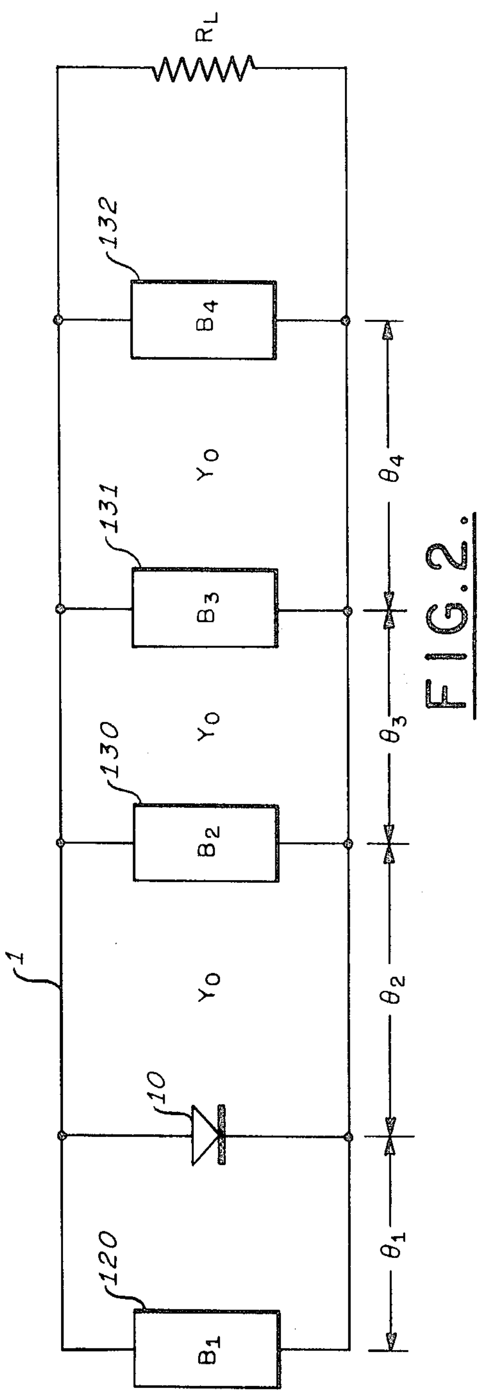
FIG. 2 is an equivalent circuit diagram useful in explaining the operation of the device of FIG. 1.

FIG. 2 will be used in further discussing one possible theory of operation of the invention. It should be observed that FIGS. 1 and 2 have been aligned one below the other in a particular way so that certain electrical reference planes bounding the phase angles $\theta_1$, $\theta_2$, $\theta_3$, and $\theta_4$ are aligned vertically. It should furthermore be observed that the lumped constant circuit of FIG. 2 is most nearly accurate in explaining operation of the invention when operating as an amplifier or oscillator. Since the illustrative embodiment of FIG. 1 involves a distributed circuit, it is recognized not to be possible with strict accuracy to define its operation at harmonically spaced frequencies using a particular lumped constant equivalent circuit. It is therefore understood that the theory is offered only to illustrate in a general way the mode of operation of the invention.

Impedance transformer 30, as shown in FIG. 1, is one-eighth wave long for the median frequency signal $\omega_F$ and is centered a distance $\theta_2$ from the plane of diode 10. Impedance transformers 31 and 32 are each also one-eighth of a wave long for signal $\omega_F$. Transformer 31 is centered a distance $\theta_3$ from the midplane of transformer 30, while transformer 32 is centered a distance $\theta_4$ from the midplane of transformer 31.

Transformer 30 is positioned substantially an electrical length $\theta_2$ from the plane of diode 10 and short 20 is so adjusted relative to the plane of diode 10 such that an electric field is maximized in the plane of diode 10. The electric field has a fundamental frequency $\omega_F$ component and strong harmonic $\omega_H$ components thereof. The angles $\theta_1$, $\theta_2$, $\theta_3$ and $\theta_4$ are also adjusted so as to permit flow of currents at the fundamental $\omega_F$ frequency or of the harmonics thereof into load $R_L$ or out of the generator in the sense of arrow 50 of FIG. 1.

Extraction of output signals may be facilitated by use of a tapered ramp impedance matching transformer 51 of conventional design for smoothly joining the ridged wave guide section 1 with a conventional rectangular wave guide output 52 to which load $R_L$ is connected. Operation of the apparatus as an amplifier may be facilitated by connecting a source and a load to junctions of a conventional circulator a third junction of which is coupled to rectangular guide 52. The tapered section 51 may, of course, be omitted if the invention is to be employed with utilization equipment constructed of ridged wave guide.

Referring again particularly to FIG. 2, the quantity $Y_o$ represents the effective characteristic admittance of the short sections of transmission line between the several shunting elements. The adjustable short circuit 20 is represented by an admittance $B_1$ placed at 120, a distance $\theta_1$ from diode 10. The quantity $B_1$ is then equal to $-Y_o \cot \theta_1$. The symbols $B_2$, $B_3$, and $B_4$ represent spaced shunt susceptances 130, 131, and 132 corresponding respectively to the matching or tuning elements 30, 31, and 32. While the exact values of $\theta_1$, $\theta_2$, $\theta_3$, and $\theta_4$ and of other parameters are not readily established by theory, experimental adjustment of such parameters enables operation of the diode 10 in the desired high efficiency mode, and the efficient extraction of fundamental and harmonic energy from the apparatus. Such high efficiency mode operation of diode 10 is made possible because of the circuit configuration causes resonant fields to appear across diode 10 at the operational fundamental frequency $\omega_F$ plus resonant fields of at least the first two of its harmonic frequencies $\omega_H$.

Assume the presence of an electrical field of frequency $\omega_F$ within guide 1. A unidirectional bias field is applied across diode 10, being derived as previously explained, from any conventional bias source. The bias signal is preferably adjusted so that the voltage across diode 10 is within a very few volts of the reverse break down point for diode 10. In the quiescent state, with no input signal at frequency $\omega_F$ present, substantially no unidirectional current flows through diode 7, and substantially no power is wasted. Undesired power consumption and heating of diode 7 is thus avoided. When high frequency energy at frequency $\omega_F$ is admitted to converter 50, the electric field across the junction of diode 7 is the sum of a unidirectional bias field component and the alternating field component of the high frequency signal $\omega_F$. Whenever the time rate of increase and the peak total field across diode 10 exceed critical values, an avalanche shock wave is generated, causing the electric field within diode 7 to fall instantaneously to a very low value.

Consequently, a large current impulse is allowed to flow from the diode 10 bias source through diode 10. Current pulse peaks of amplitude of the order of 10 times the amplitude of the high frequency signal $\omega_F$ have been experimentally observed. This current surge is abrupt and therefore has a rich harmonic content, so that a harmonic signal electric field of frequency $\omega_F$ also appears across diode 10 and can also readily be coupled from the converter. Amplification of the signal obtains because the relatively small excursions of the $\omega_F$ signal, swinging only a few volts relative to the break down voltage of diode 10, trigger a relatively large swing in current flowing through diode 10. Because of the wide diode current swing from a value of substantially zero, amplification and frequency multiplication is an efficient process.

For example, the invention when used with an IMPATT diode operating in the high efficiency mode as an amplifier at 8.6 GHz., has produced an output of 19 watts at 29 percent efficiency with 7 db. gain. As an oscillator, an output upwards of 10 watts at a 25 percent efficiency has been demonstrated. Efficient second harmonic generation is, for instance, also readily demonstrated in the 15 to 18 GHz. region (10 watts at 13 percent efficiency at 16.5 GHz.). No power is lost in the absence of the signal $\omega_F$. Simple, readily adjusted circuit elements are thus employed to yield efficient energy conversion with freedom from propagation moding and instability problems.

While the invention has been described in its preferred embodiment, it is to be understood that the words that have been used are words of description rather than limitation and that changes within the purview of the appended claims may be made without departing from the true scope and spirit of the invention in its broader aspects.

I claim:

1. A high frequency energy converter comprising:

hollow transmission line means having first and second opposed inner surface means adapted to supply output high frequency signals, said first inner surface means having reentrant ridged means extending toward said second inner surface means, conductive wall means for conductively short circuiting said hollow transmission line means adjacent one end thereof, negative-resistance high frequency avalanche semiconductor diode means adjacent said conductive wall means in shunt relation for high frequency energy within said transmission line means between said ridge means and said second inner surface means, circuit means for biasing said avalanche diode means with a unidirectional electric field below its characteristic break down field so that substantially no bias current flows through said avalanche diode means, means for supplying a high frequency carrier field across said diode means superimposed upon said unidirectional electric field so that the total electric field across said avalanche diode means rises above a critical value, thereupon triggering bias current flow through said diode means for the purpose of exciting amplified high frequency fields in said hollow transmission line means, first impedance transformer means spaced from said avalanche diode means within said hollow transmission line means in contact with said second inner surface means and adapted to produce substantially resonant carrier and harmonic frequency fields across said diode means in a first portion of said transmission line means, and second impedance transformer means spaced from said first impedance transformer means within said hollow transmission line means in contact with said inner surface means and adapted to cause resonance within a second portion of said transmission line means selectively to said carrier frequency and to two of its harmonics.

2. Apparatus as described in claim 1 wherein said conductive wall means, said avalanche diode means and said impedance matching means are so constructed and arranged as to provide oscillating high frequency energy with strong fundamental and harmonic components in the plane of said diode means.

3. Apparatus as described in claim 1 wherein said circuit means comprises conductor means passing through said ridge portion in capacity coupled relation therewith for excluding high frequency energy flow on said conductor.

4. Apparatus as described in claim 1 wherein said second impedance transformer means comprises first and second spaced transformer elements.

5. Apparatus as described in claim 4 wherein said first impedance transformer means and said second and third spaced transformer elements each comprise substantially similar bodies of electrically conductive material spaced along said ridged means for forming low impedance sections of of transmission line in cooperation with said ridged means.

6. Apparatus as in claim 5 wherein said bodies have a dimension along said ridged means substantially equal to one-eighth wavelength at the frequency of said resonant carrier field.

* * * * *